(12) United States Patent
Kumar et al.

(10) Patent No.: US 9,990,984 B1
(45) Date of Patent: Jun. 5, 2018

(54) PULSE-STRETCHER CLOCK GENERATOR CIRCUIT FOR HIGH SPEED MEMORY SUBSYSTEMS

(71) Applicant: QUALCOMM Incorporated, San Diego, CA (US)

(72) Inventors: Dorav Kumar, San Diego, CA (US); Venkat Narayanan, San Diego, CA (US); Bilal Zafar, San Diego, CA (US); Seid Hadi Rasouli, San Diego, CA (US); Venugopal Boynapalli, San Marcos, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days. days.

(21) Appl. No.: 15/370,892

(22) Filed: Dec. 6, 2016

(51) Int. Cl.
| | |
|---|---|
| *G11C 11/4094* | (2006.01) |
| *G11C 11/4076* | (2006.01) |
| *G06F 1/12* | (2006.01) |
| *G06F 1/06* | (2006.01) |

(52) U.S. Cl.
CPC ............ *G11C 11/4094* (2013.01); *G06F 1/06* (2013.01); *G06F 1/12* (2013.01); *G11C 11/4076* (2013.01)

(58) Field of Classification Search
CPC ........ G11C 7/1051; G11C 7/1078; G11C 7/22
USPC ......................... 365/189.05, 185.19
See application file for complete search history.

(56) References Cited

U.S. PATENT DOCUMENTS

| | | | |
|---|---|---|---|
| 6,130,846 A | 10/2000 | Hori et al. | |
| 6,665,222 B2 * | 12/2003 | Wright ................. | G11C 7/1072 365/193 |
| 7,006,403 B2 | 2/2006 | Joshi et al. | |
| 7,432,752 B1 * | 10/2008 | Lee ........................ | H03K 5/06 327/172 |
| 8,014,485 B2 * | 9/2011 | Kwan ...................... | G06F 1/08 375/376 |

(Continued)

FOREIGN PATENT DOCUMENTS

EP        1093228 A1     4/2001

OTHER PUBLICATIONS

Sedra Smith, Microelectronic Circuits, Sixth Edition.*
International Search Report and Written Opinion—PCT/US2017/060213—ISA/EPO—dated Jan. 26, 2018.

*Primary Examiner* — Hoai V Ho
*Assistant Examiner* — Minh Dinh
(74) *Attorney, Agent, or Firm* — Arent Fox, LLP and Qualcomm Incorporated

(57) ABSTRACT

The apparatus provided includes a memory. The memory is configured to receive a memory clock. The apparatus also includes a single stage logic gate configured to generate the memory clock from a reference clock. The memory clock is a gated clock. Additionally, the memory clock has a wider pulse width than the reference clock. In an example, the single stage logic gate comprises a pull-up circuit configured to pull-up the memory clock, and a pull-down circuit coupled to pull-down the memory clock. In an example, the pull-up and the pull-down circuits are configured to be controlled by the reference clock, a delayed reference clock, and a gating signal. An example further includes a delay circuit configured to generate the delayed reference clock from the reference clock. An example further includes a latch configured to generate the gating signal.

14 Claims, 9 Drawing Sheets

(56) References Cited

U.S. PATENT DOCUMENTS

| | | | | |
|---|---|---|---|---|
| 8,552,778 B2 | * | 10/2013 | Sofer | H03K 5/1565 327/175 |
| 2003/0088801 A1 | * | 5/2003 | Jain | G06F 13/4226 713/400 |
| 2013/0257498 A1 | | 10/2013 | Ge et al. | |
| 2015/0084673 A1 | | 3/2015 | Fleischer et al. | |

* cited by examiner

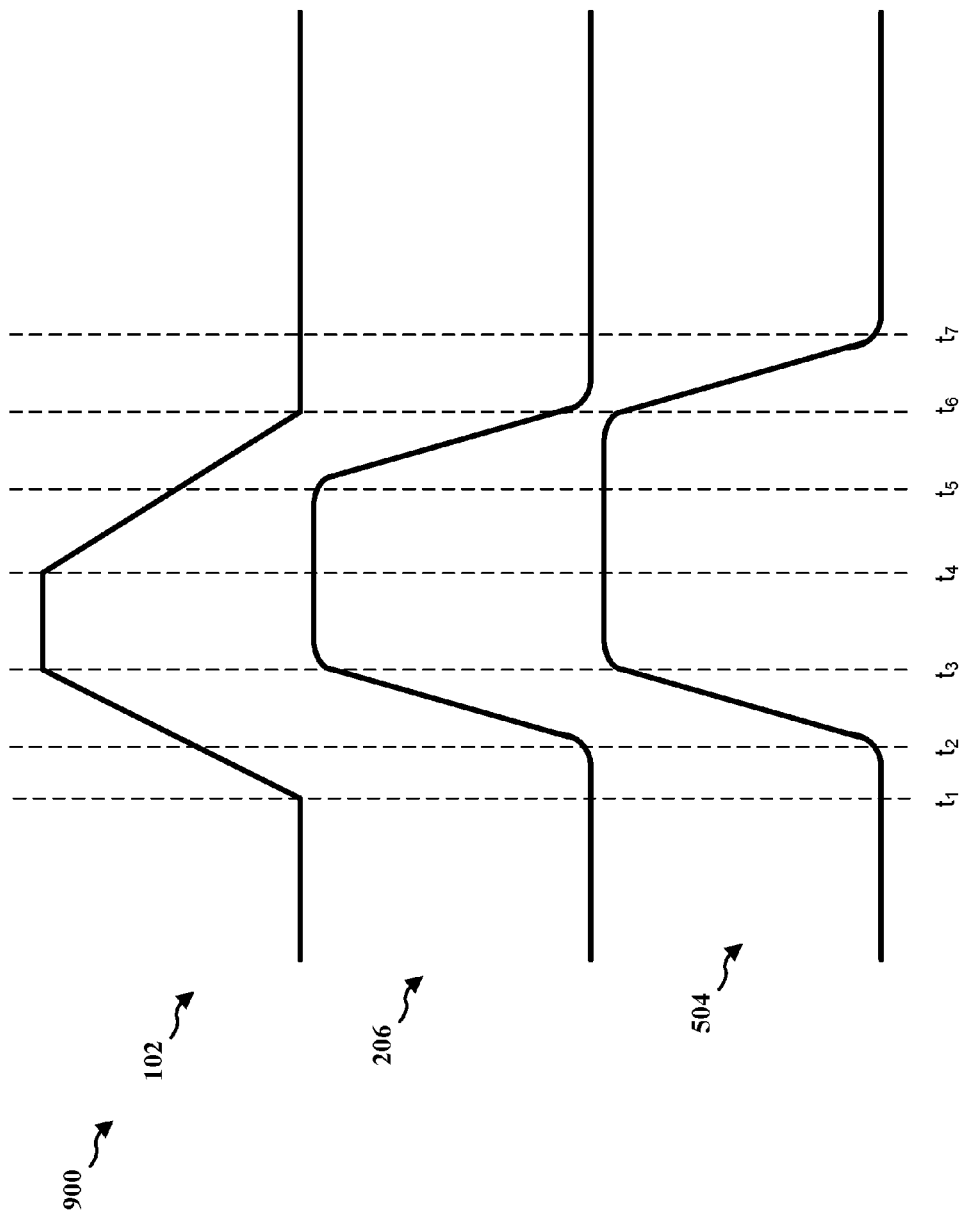

PULSE-STRETCHER CLOCK GENERATOR CIRCUIT FOR HIGH SPEED MEMORY SUBSYSTEMS

BACKGROUND

Field

The present disclosure relates generally to memory systems, and more particularly, to pulse stretching circuitry.

Background

Some memory devices may use pulse latches in a memory's input paths to improve performance. The use of pulse latches in a memory's input paths leads to minimum pulse width requirements so that the latch can be written to in the presence of clock signal variation across the die of the device.

In CPU Level 2 or Level 3 caches, cache accesses and cache writes may be multi-cycle operations. Memory cycle time may usually be relaxed. Additionally, the memory clock used with the CPU architecture may be a pulsed clock. As clock frequency increases, minimum pulse width requirements may begin to limit the maximum system clock (e.g., CPU clock) frequency used to generate a memory clock.

SUMMARY

The following presents a simplified summary of one or more aspects in order to provide a basic understanding of such aspects. This summary is not an extensive overview of all contemplated aspects, and is intended to neither identify key or critical elements of all aspects nor delineate the scope of any or all aspects. Its sole purpose is to present some concepts of one or more aspects in a simplified form as a prelude to the more detailed description that is presented later.

In an aspect of the disclosure, a memory apparatus is provided. The memory apparatus may include a memory. The memory may be configured to receive a memory clock. The memory apparatus may also include a single stage logic gate. The single stage logic gate may be configured to generate the memory clock from a reference clock. The memory clock may be a gated clock and have a wider pulse width than the reference clock.

In an aspect of the disclosure, an apparatus is provided. The apparatus may include a processor. The apparatus may also include a memory. The memory may be configured to receive a memory clock. The memory apparatus may also include a single stage logic gate. The single stage logic gate may be configured to generate the memory clock from a reference clock. The memory clock may be a gated clock and have a wider pulse width than the reference clock.

In an aspect of the disclosure, a memory apparatus is provided. The memory apparatus may include means to store data configured to receive a memory clock. The memory apparatus may include means to generate the memory clock from a reference clock in a single logic gate stage. The memory clock may be a gated clock and may have a wider pulse width than the reference clock.

To the accomplishment of the foregoing and related ends, the one or more aspects comprise the features hereinafter fully described and particularly pointed out in the claims. The following description and the annexed drawings set forth in detail certain illustrative features of the one or more aspects. These features are indicative, however, of but a few of the various ways in which the principles of various aspects may be employed, and this description is intended to include all such aspects and their equivalents.

BRIEF DESCRIPTION OF THE DRAWINGS

FIG. 9 is a timing diagram illustrating an example clock signal and a CGC pulse 206.

DETAILED DESCRIPTION

Figure 1:
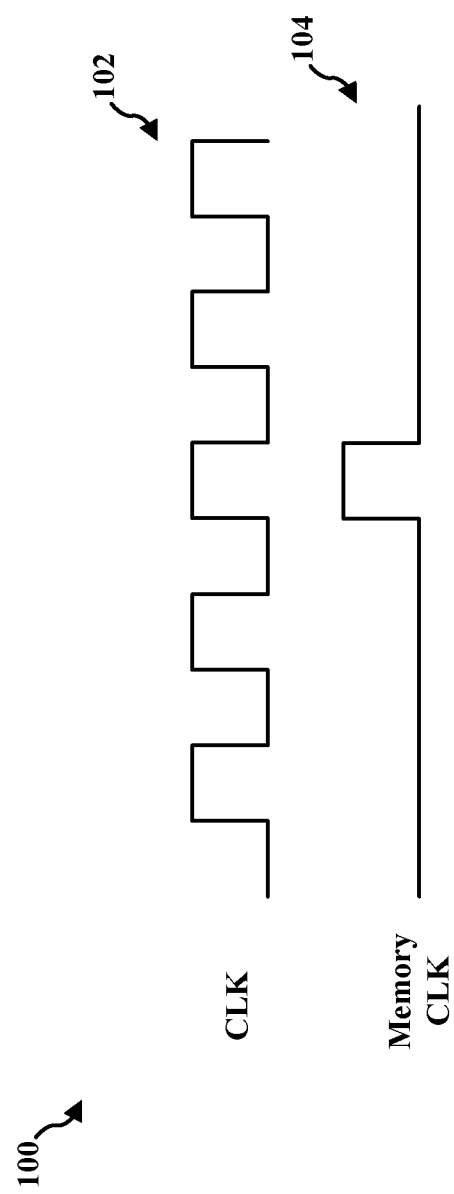
FIG. 1 is a diagram illustrating a graph of clock signals.

The detailed description set forth below in connection with the appended drawings is intended as a description of various configurations and is not intended to represent the only configurations in which the concepts described herein may be practiced. The detailed description includes specific details for the purpose of providing a thorough understanding of various concepts. However, the concepts described herein may be practiced without these specific details as will be apparent to those skilled in the art. In some instances, well known structures and components are shown in block diagram form in order to avoid obscuring such concepts.

Several aspects of telecommunication systems will now be presented with reference to various apparatus and methods. These apparatus and methods will be described in the following detailed description and illustrated in the accompanying drawings by various blocks, components, circuits, processes, algorithms, etc. (collectively referred to as "elements"). These elements may be implemented using electronic hardware, computer software, or any combination thereof. Whether such elements are implemented as hardware or software depends upon the particular application and design constraints imposed on the overall system.

By way of example, an element, or any portion of an element, or any combination of elements may be implemented as a "processing system" that includes one or more processors. Examples of processors include microprocessors, microcontrollers, graphics processing units (GPUs), central processing units (CPUs), application processors, digital signal processors (DSPs), reduced instruction set computing (RISC) processors, systems on a chip (SoC), baseband processors, field programmable gate arrays (FPGAs), programmable logic devices (PLDs), state machines, gated logic, discrete hardware circuits, and other suitable hardware configured to perform the various functionality described throughout this disclosure. One or more processors in the processing system may execute software. Software shall be construed broadly to mean instructions, instruction sets, code, code segments, program code, programs, subprograms, software components, applications, software applications, software packages, routines, subroutines, objects, executables, threads of execution, procedures, functions, etc., whether referred to as software, firmware, middleware, microcode, hardware description language, or otherwise.

Accordingly, in one or more example embodiments, the functions described may be implemented in hardware, software, or any combination thereof. If implemented in software, the functions may be stored on or encoded as one or more instructions or code on a computer-readable medium. Computer-readable media includes computer storage media. Storage media may be any available media that can be accessed by a computer. By way of example, and not limitation, such computer-readable media can include a random-access memory (RAM), a read-only memory (ROM), an electrically erasable programmable ROM (EEPROM), optical disk storage, magnetic disk storage, other magnetic storage devices, combinations of the aforementioned types of computer-readable media, or any other medium that can be used to store computer executable code in the form of instructions or data structures that can be accessed by a computer.

FIG. 1 is a diagram illustrating a graph 100 of clock signals. The clock signals include a clock (CLK) 102 and a Memory CLK 104. The Memory CLK 104 may be generated from the CLK 102. Additionally, the CLK 102 may be a central processing unit (CPU) CLK. For example, in an example processor based system, the Memory CLK 104 may be generated based on a CPU CLK of the system. By generating the Memory CLK based on the CPU CLK, the memory in the system and the CPU in the system may be synchronized to each other.

In the illustrated example of FIG. 1, the Memory CLK 104 has a lower frequency than the CLK 102. For example, a circuit generating the Memory CLK 104 may not be enabled for each clock edge of the CLK 102. Accordingly, the Memory CLK 104 has a lower duty cycle than the CLK 102. For example, in the illustrated example, the Memory CLK 104 has a single clock pulse in a same period during which the CLK 102 has multiple clock pulses.

Although not illustrated in FIG. 1, the Memory CLK 104 may be skewed relative to the CLK 102. Skew between the CLK 102 and the Memory CLK 104 may be due to delays across a die. The delays may be due to the length of a signal path or signal paths on the die, delays through buffer circuits, delays through logic circuits, other delays, or some combination of such delays. Additionally, the pulse width of the Memory CLK 104 may also be distorted, e.g., decreased. For example, the pulse width of the Memory CLK 104 may be distorted by the resistance and capacitance along the length of the signal path or signal paths on the die, distortion through the buffer circuits, distortion through logic circuits, or a combination of such distortion.

In some process technologies, such as a 14 nm Low Power Plus (14LPP) process technology, a first-generation 10 nm process (10LPE) process technology, or other process technology, for example, a minimum pulse width requirements for a memory may be one aspect that may determine or be a factor in setting the maximum operating clock frequency (fMAX), e.g., for the memory device. Additionally, for some memory designs, a design violation of fMAX may not be discovered until fairly late in the design process. A design violation of fMAX may include a memory design with circuitry within the memory design that cannot be clocked at fMAX. Accordingly, meeting the design requirements for fMAX may be difficult because a violation of fMAX may take time to discover, which may increase the time to design a memory. Accordingly, violations of fMAX may delay design roll-out. Furthermore, products may be launched that have lower performance than originally planned. For example, when a circuit design does not meet fMAX, the fMAX of the circuit design may have to be adjusted, e.g., the clock rate used may need to be lowered.

In some examples, tighter clock slews may help. Clock skew may occur when a clock signal arrives at different components at different times. Tighter clock slews may allow for higher fMAX because lower clock slew may allow a shorter time interval between clock pulses. The impact of tighter clock slew on the performance of a design may be low, however. Accordingly, an aspect of the disclosure may correct for violations of fMAX at the subsystem level. In other words, subsystems within a memory system may be designed to compensate for memory that may not meet the fMAX requirement.

Figure 2:
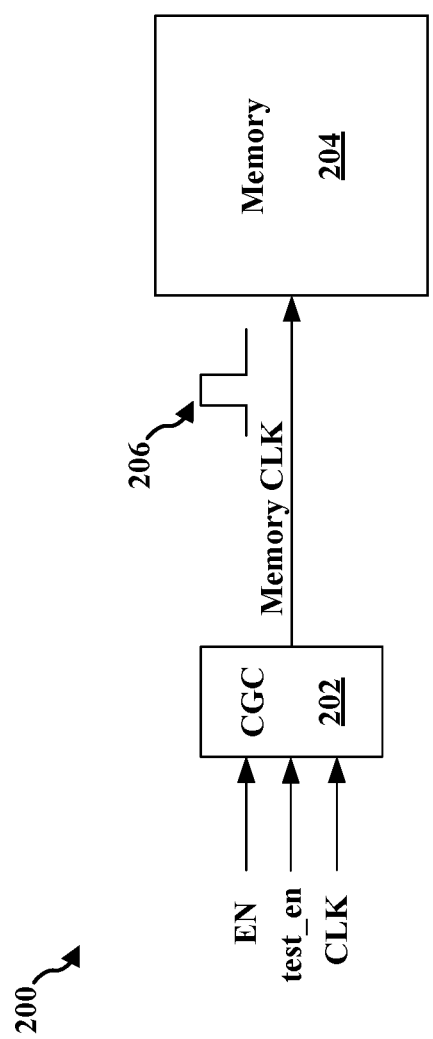
FIG. 2 is a block diagram illustrating a clocked memory system.

FIG. 2 is a block diagram illustrating a clocked memory system 200. The clocked memory system 200 includes a clock gating cell (CGC) 202 and a memory 204. The CGC 202 may generate a memory clock signal 206 for the memory 204. The example of FIG. 2 may have a minimum pulse width limitations on the clock. The minimum pulse width limitations on the clock may limit fMAX. As the clock frequency increases, generating a pulse that meets the minimum pulse width limitations may be more difficult. For example, for CGC 202, the pulse width of the memory clock signal 206 may be based on the pulse width of the input clock (CLK). Accordingly, the pulse width limitations of the memory clock signal 206 may set the pulse width of the input clock (CLK), which may limit the maximum frequency of the input clock (CLK), fMAX.

The CGC 202 may enable and disable the propagation of the memory clock signal 206 to the memory 204. For example, the CGC 202 may enable and disable the propagation of the memory clock signal 206 to the memory 204 when the memory 204 is not being used.

The CGC 202 may enable and disable the propagation of the memory clock signal 206 to the memory 204 to reduce the dynamic power used by the memory 204. Accordingly, the CGC 202 may include an enable signal (EN) and a clock input (CLK). The enable signal (EN) may enable and disable the propagation of the memory clock signal 206 to the memory 204. The CGC 202 may also include a test enable signal (test_en) that may enable the CGC 202 for testing purposes.

The memory clock signal 206 (Memory CLK) may be generated based on the clock input (CLK), which may be a processor clock. Accordingly, the memory clock signal 206 (Memory CLK) and the processor clock may be synchronized.

The memory 204 may be a Dynamic Random Access Memory (DRAM). The DRAM may be asynchronous. The signals related to the DRAM may generally be generated by a clocked memory controller, such as the CGC 202, however. The clocked memory controller, e.g., the CGC 202, may limit the timing of the memory clock signal 206 for the DRAM to multiples of the controller's clock cycle, e.g., a CPU CLK.

A clock signal may be skewed due to delays caused by the length of a signal path or signal paths on a die, delays through buffer circuits, delays through logic circuits, other delays, or some combination of such delays. Additionally, the pulse width of clock signals may also be distorted by the resistance and capacitance along the length of the signal path or signal paths on the die, distortion through the buffer circuits, distortion through logic circuits, or a combination of the resistance and capacitance along the length of the signal path or signal paths on the die, distortion through the buffer circuits, or distortion through logic circuits. Clock skew and clock distortions may impact the fMAX of the memory clock signal 206, however. The memory clock signal 206 for the memory 204 generated for the clocked memory system 200 using the CGC 202 may have a limited fMAX due to clock skew and clock distortions. The CGC 202 may receive a clock input (CLK) that may be a CPU CLK and generate a Memory CLK. For example, the CGC 202 may receive the CLK 102 and generate the Memory CLK 104 of FIG. 1.

Figure 3:
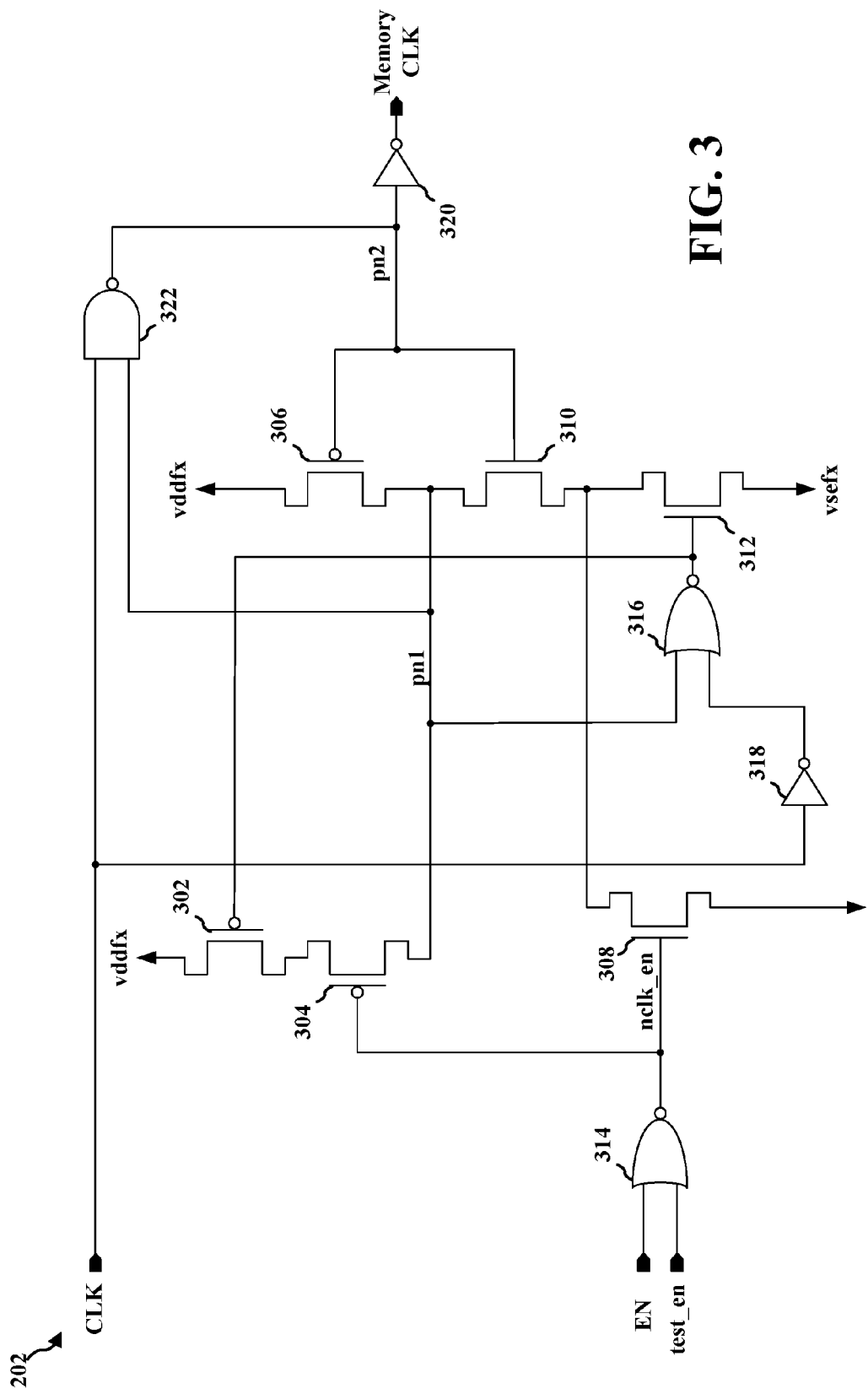
FIG. 3 is a diagram illustrating a CGC at a gate and individual transistor level.

FIG. 3 is a diagram illustrating a CGC 202 at a gate and an individual transistor level. The diagram of FIG. 3 includes individual transistors, including p-type metal oxide semiconductor (PMOS) transistors 302, 304, 306, and n-type metal oxide semiconductor (NMOS) transistors 308, 310, 312. The diagram of FIG. 3 also includes a several gates, including NOR gates 314, 316, and inverters 318, 320.

In the CGC 202, the NAND gate 322 may gate the clock input (CLK). The inverter 320 may invert the output of the NAND gate 322 (pn2). Inverting the output of NAND gate 322 (pn2) may ensure that the clock input (CLK) and the clock output, Memory CLK, are in phase or nearly in phase with each other. The NOR gate 314 may be used to enable and disable the CGC 202. For example, the NOR gate 314 may have an enable input (EN) and a test enable input (test_en) as inputs. The NOR gate 314 generates an internal enable signal, nclk_en. When neither EN nor test_en are active, e.g., a logic high voltage, the internal enable signal, nclk_en, will be a logic high voltage.

When pn2 is a logic low voltage (e.g., when the Memory CLK is a logic high voltage), the PMOS transistor 306 may be on and the NMOS transistor 310 may be off. When the PMOS transistor 306 is on and the NMOS transistor 310 is off pn1 may be pulled up, e.g., to Vddfx. For example, when the PMOS transistor 306 is on pn1 may be coupled through the PMOS transistor 306 to vddfx, which may be a positive power supply voltage.

When nclk_en signal is a logic high voltage (e.g., when the Memory CLK is a logic low voltage), the PMOS transistor 304 may be off and the NMOS transistor 308 may be on. Accordingly, the signal on pn1 may depend on the PMOS transistor 306 and the NMOS transistors 310, 312. When pn2 is a logic high voltage, the PMOS transistor 306 is off and the NMOS transistor 310 may be on. When the NMOS transistor 310 is on pn2 will be coupled to pn1. When the PMOS transistor 306 may be off and the NMOS transistor 310 is on and the NMOS transistor 308 is on, pn1 and pn2 may be pulled down, e.g., to Vsefx. The pn2 may be pulled down through the NMOS transistors 310, 308. The pn1 signal may be pulled down through the NMOS transistor 308. Accordingly, when the nclk_en signal is a logic high voltage, e.g., when the CGC 202 is "disabled," the pn1 signal will either be a logic low voltage (when the Memory CLK is low) or will transition to a logic low voltage after the Memory CLK transitions low. As long as the pn1 signal is a logic low voltage, e.g., when the CGC 202 is "disabled," the CLK signal will be disabled by the NAND gate 322 such that the Memory CLK signal will not toggle.

When the CGC 202 is "enabled," e.g., when one or more of the enable (EN) or test enable (test_en) signals are active, the nclk_en signal will be a logic low voltage. Accordingly, the NMOS transistor 308 may be off and the PMOS transistor 304 may be on. Accordingly, the pn1 signal may be pulled to a logic high voltage when the PMOS transistor 302 is on. The PMOS transistor 302 may be on when the output of the NOR gate 316 is a logic low voltage. The output of the NOR gate 316 may be a logic low voltage when the pn1 signal is a logic low voltage or when the clock input signal (CLK) is a logic low voltage. The output of the NOR gate 316 may be a logic high voltage when the pn1 signal is a logic low voltage and the clock input signal (CLK) is a logic high voltage.

When the output of the NOR gate 316 is a logic high voltage, the NMOS transistor 312 may be on. When the NMOS transistor 312 is on and when pn2 is a logic high voltage (e.g., when Memory CLK is a logic low voltage), the NMOS transistor 310 may be on. Accordingly, the pn1 signal may be pulled low through the NMOS transistors 310, 312. With the CGC 202 "enabled," e.g., when one or more of the enable (EN) or test enable (test_en) signals are active, the output of the NOR gate 316 may remain a logic low value and pn1 may continue to be pulled to a logic high value through PMOS transistors 302, 304. Accordingly, the clock (CLK) may be passed through the NAND gate 322, through the inverter 320 to output Memory CLK.

Figure 4:
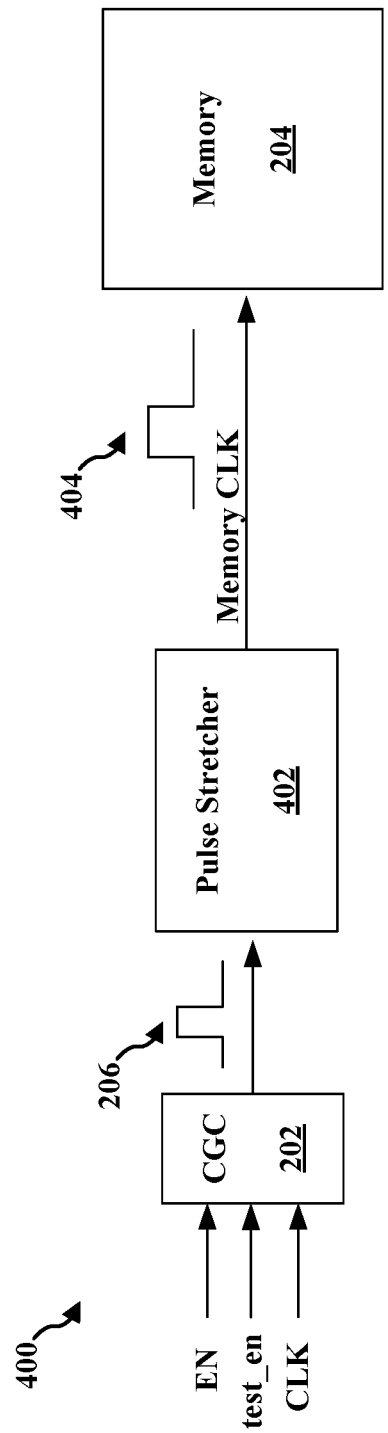
FIG. 4 is another block diagram illustrating another clocked memory system.

FIG. 4 is another block diagram illustrating another clocked memory system 400 employing a pulse stretcher according to an aspect of the systems and methods described herein. The clocked memory system 400 includes the CGC 202 and the memory 204. The CGC 202 may generate a clock signal 206. The example of FIG. 4 may have minimum pulse width limitations on the clock signal for memory 204. In order to overcome the minimum pulse width limitations on the clock, the example of FIG. 4 also includes a pulse stretcher 402. A pulse stretcher such as the pulse stretcher 402 may be a circuit that produces an output pulse whose duration may be greater than that of an input pulse and whose amplitude is proportional to a peak amplitude of the input pulse.

The pulse stretcher 402 may have an input signal, the clock signal 206. The pulse stretcher 402 may output a pulse stretched clock signal, Memory CLK 404. The clock signal Memory CLK 404 may be an output pulse with a duration greater than that of an input pulse, the memory clock signal 206. Additionally, the clock signal 404 may be an output pulse with an amplitude that is proportional to a peak amplitude of the input pulse, the memory clock signal 206. According, the design illustrated in FIG. 4 may increase clock latency because the pulse stretcher 402 increases delay, e.g., between an edge of the clock signal 404 and an edge of the memory clock signal 206.

The lengthened clock pulse may lessen the impact of clock skew and clock distortion. For example, using the lengthened clock pulse, meeting or overcoming the minimum pulse width limitations on the clock may be easier because the clock pulse width may be longer. Accordingly, clock skew and clock distortions may have less of an impact on the fMAX of the Memory CLK to the memory 204 of FIG. 4. However, the pulse stretcher 402 may increase delay and increase the difference between clock edges of the CLK and the Memory CLK.

The CGC 202 of FIG. 4 may be the same or similar to the CGC 202 of FIG. 2. Accordingly, the CGC 202 of FIG. 4 may enable and disable the propagation of the memory clock signal 206. The pulse width of the memory clock signal 206 may be stretched through the pulse stretcher 402 to the memory 204. The CGC 202 may enable and disable the propagation of the memory clock signal 206 to the memory 204 when the memory 204 is not being used, e.g., to reduce the dynamic power used by the memory 204. Accordingly, the CGC 202 may include an enable signal (EN) and a clock input (CLK). The enable signal (EN) may enable and disable the propagation of the memory clock signal 206 to the memory 204. The CGC 202 may also include a test enable signal (test_en) that may enable the CGC 202 for testing purposes. Stretching the memory clock signal (Memory CLK 404) may improve margins so that the clock used to generate the memory clock may be a higher frequency.

The memory clock signal 206 (Memory CLK) may be generated based on the clock input (CLK), which may be a processor clock. Accordingly, the memory clock signal 206 and the processor clock may be synchronized. The memory clock signal 206 may be stretched using the system of FIG. 4. However, the system of FIG. 4 may also delay the memory clock signal 206 more than the other example systems and methods described herein. Additionally, the memory 204 of FIG. 4 may also be a DRAM.

Figure 5:
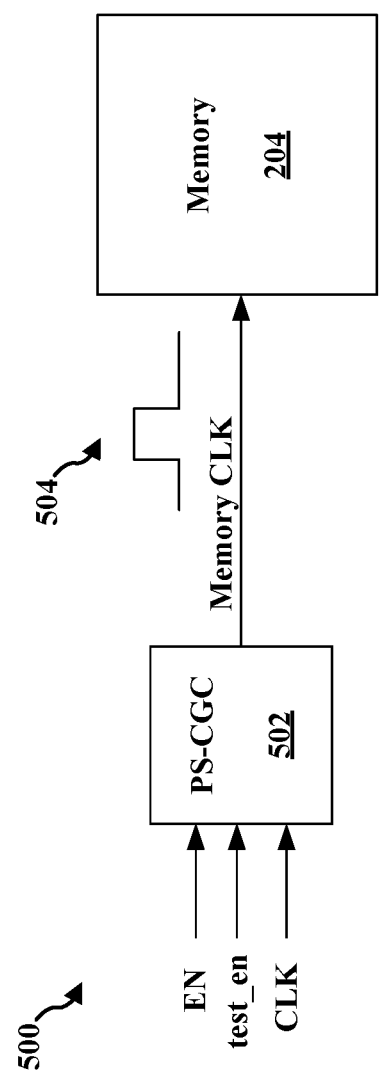
FIG. 5 is another block diagram illustrating another clocked memory system.

FIG. 5 is another block diagram illustrating another clocked memory system 500. The clocked memory system 500 includes a Pulse Stretcher (PS) CGC 502 and the memory 204. The PS-CGC 502 may generate a clock signal 504 for the memory 204. The clock signal 504 (Memory CLK) may be pulse stretched relative to the duty cycle of the clock CLK input to the PS-CGC 502. For example, the clock signal 504 may be a CPU CLK and the clock signal 504 may be pulse stretched, e.g., the pulse width may be increased, relative to the duty cycle of the CPU CLK. Accordingly, the clocked memory system of FIG. 5 may be clocked at a higher frequency and still meet minimum pulse width limitations on the clock because the pulse is stretched relative to the input clock.

The PS-CGC 502 may maintain a low insertion delay while selectively delaying the falling edge of the clock signal to the memory. (Insertion delay may be the time taken by the clock signal to reach the register from its source point.) Accordingly, the memory apparatus (e.g., clocked memory system 500) includes the memory 204. The memory 204 may be configured to receive the memory clock (Memory CLK). The memory apparatus (e.g., clocked memory system 500) also includes a single stage logic gate. The single stage logic gate may be configured to generate the memory clock (Memory CLK) from a reference clock (e.g., CLK, CPU CLK). (See FIG. 7 for more details regarding an example single stage logic gate.) The memory clock may be a gated clock. Additionally, the memory clock may have a wider pulse width than the reference clock. The single stage logic gate (discussed in more detail with respect to FIGS. 6-7) may be the circuitry that allows the PS-CGC 502 to maintain a low insertion delay while selectively delaying the falling edge of the clock signal input to the memory.

The PS-CGC 502 of FIG. 5 may be the same or similar to the CGC 202 of FIGS. 2 and 4. Accordingly, the CGC 202 of FIG. 5 may enable and disable the propagation of the memory clock signal 206. For example, the CGC 202 may enable and disable the propagation of the memory clock signal 206 to the memory 204 when the memory 204 is not being used, e.g., to reduce the dynamic power used by the memory 204. Accordingly, the CGC 202 may include an enable signal (EN) and a clock input (CLK). The enable signal (EN) may enable and disable the propagation of the memory clock signal 206 to the memory 204. The CGC 202 may also include a test enable signal (test_en) that may enable the CGC 202 for testing purposes.

The clock signal 504 (Memory CLK) may be generated based on the clock input (CLK), which may be a processor clock (CPU CLK). Accordingly, the memory clock signal 206 and the processor clock may be synchronized. The memory clock signal 206 may be stretched. The memory clock signal 206 may also be delayed, however, the delay may be lower when compared to the example of FIG. 5. The memory 204 of FIG. 5 may also be a DRAM.

Figure 6:
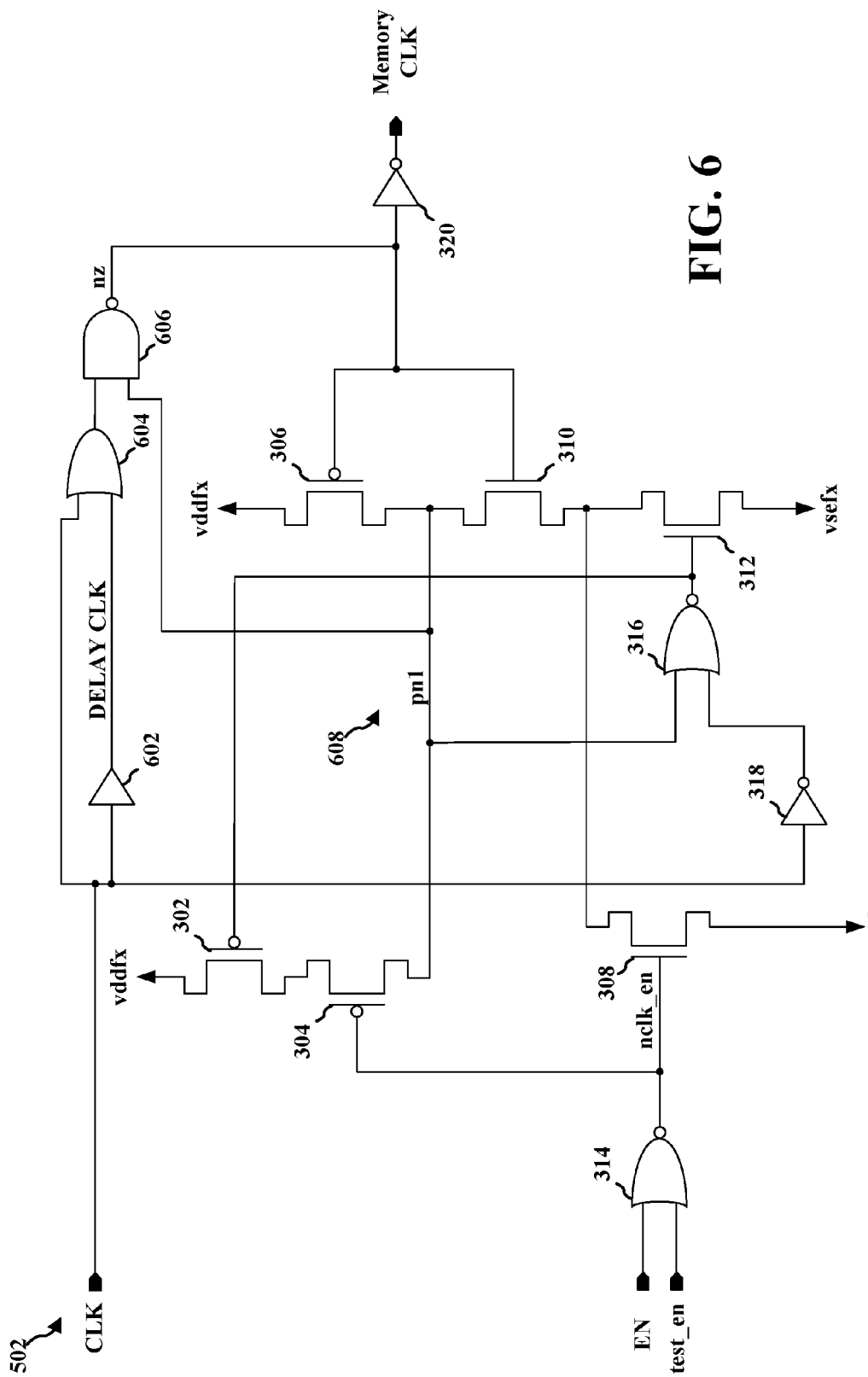
FIG. 6 is a diagram illustrating a pulse lengthening CGC at a gate and an individual transistor level in accordance with the systems and methods proposed.

FIG. 6 is a diagram illustrating a pulse lengthening PS-CGC 502 at a gate and an individual transistor level in accordance with the systems and methods proposed for lengthening a pulse, e.g., to increase a clock pulse width. The falling edge delay of the memory clock output (Memory CLK) may be made programmable based on the delay through the delay buffer used. Similar to FIG. 3, the diagram of FIG. 6 includes individual transistors, including p-type metal oxide semiconductor (PMOS) transistors 302, 304, 306, and n-type metal oxide semiconductor (NMOS) transistors 308, 310, 312. The diagram of FIG. 6 also includes a several gates, including NOR gates 314, 316, inverters 318, 320.

The PS-CGC 502 includes a buffer 602, OR gate 604, and a NAND gate 606. The buffer 602 generates a delayed clock (Delayed CLK). The delayed clock (Delay CLK) and the clock (CLK) may be OR'ed together in the OR gate 604 to generate a stretched pulse clock. In the PS-CGC 502, the NAND gate 606 may gate the clock input (CLK). The inverter 320 may invert the output of the NAND gate 606 (nz). Inverting the output of NAND gate 606 (nz) may ensure that the clock input (CLK) and the clock output, Memory CLK are in phase or nearly in phase with each other. The NOR gate 314 may be used to enable and disable the CGC 202. For example, the NOR gate 314 may have an enable input (EN) and a test enable input (test_en) as inputs. The NOR gate 314 generates an internal enable signal, nclk_en. When neither EN nor test_en are active, e.g., a logic high voltage, the internal enable signal, nclk_en, will be a logic high voltage.

When nz is a logic low voltage (e.g., when the Memory CLK is a logic high voltage), the PMOS transistor 306 may be on and the NMOS transistor 310 may be off. When the PMOS transistor 306 is on and the NMOS transistor 310 is off pn1 may be pulled up. For example, when the PMOS transistor 306 is on pn1 may be coupled to vddfx, which may be a positive power supply voltage through the PMOS transistors 306.

When nclk_en signal is a logic high voltage (e.g., when the Memory CLK is a logic low voltage), the PMOS transistor 304 may be off and the NMOS transistor 308 may be on. Accordingly, the signal on pn1 may depend on the PMOS transistor 306 and the NMOS transistors 310, 312. When nz is a logic high voltage, the PMOS transistor 306 may be off and the NMOS transistor 310 may be on. When the NMOS transistor 310 is on nz will be coupled to pn1. When the PMOS transistor 306 may be off and the NMOS transistor 310 is on and the NMOS transistor 308 is on, pn1 and nz may be pulled down. The nz may be pulled down through the NMOS transistors 310, 308. The pn1 signal may be pulled down through the NMOS transistor 308. Accordingly, when the nclk_en signal is a logic high voltage, e.g., when the CGC 202 is "disabled," the pn1 signal will either be a logic low voltage (when the Memory CLK is low) or will transition to a logic low voltage after the Memory CLK transitions low. As long as the pn1 signal is logic low voltage, e.g., when the CGC 202 is "disabled," the CLK signal will be disabled by the NAND gate 606 such that the Memory CLK signal will not toggle.

When the CGC 202 is "enabled," e.g., when one or more of the enable (EN) or test enable (test_en) signals are active, the nclk_en signal will be a logic low voltage. Accordingly, the NMOS transistor 308 may be off and the PMOS transistor 304 may be on. Accordingly, the pn1 signal may be pulled to a logic high voltage when the PMOS transistor 302 is on. The PMOS transistor 302 may be on when the output of the NOR gate 316 is a logic low voltage. The output of the NOR gate 316 may be a logic low voltage when the pn1 signal is a logic low voltage or when the clock input signal (CLK) is a logic low voltage. The output of the NOR gate 316 may be a logic high voltage when the pn1 signal is a logic low voltage and the clock input signal (CLK) is a logic high voltage. The functionality of the OR gate 604 and the NAND gate 606 illustrated in FIG. 6 may be generated using NMOS and PMOS transistors as discussed with respect to FIG. 7. The NMOS and PMOS transistors may be configured to have a single stage of delay even though the NMOS and PMOS transistors implement the OR and NAND functions. The NMOS and PMOS transistors having a single stage of delay may be referred to as a single stage logic gate.

Figure 7:
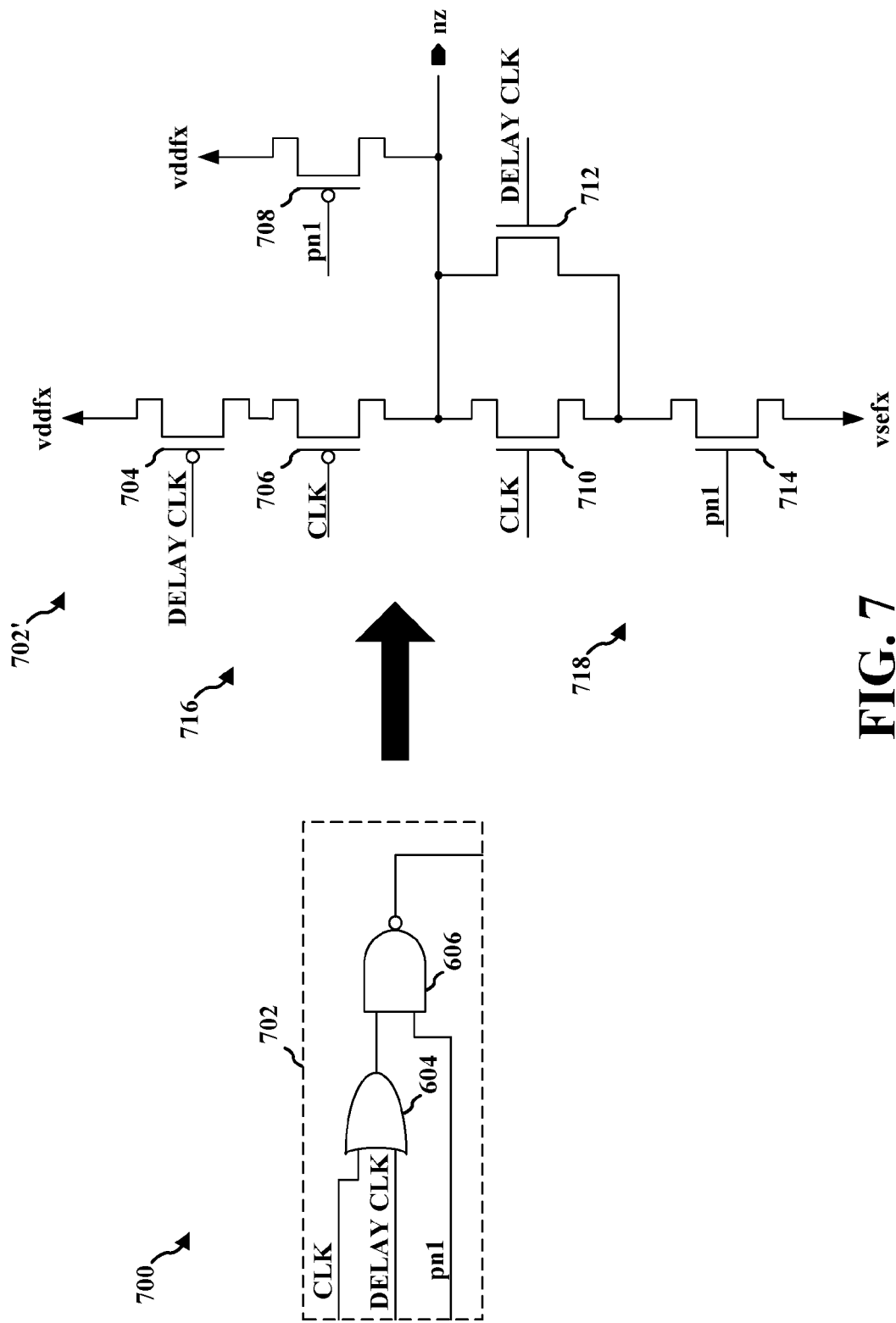
FIG. 7 is a diagram illustrating a transistor level implementation of the OR gate and NAND gate circuit using an OR-AND-Inverter (OAI) circuit topology, in accordance with the systems and methods proposed.

FIG. 7 is a diagram 700 illustrating a transistor level implementation 702' of the OR gate 604 and NAND gate 606 circuit 702 using an OR-AND-Inverter (OAI) circuit topology, in accordance with the systems and methods proposed. The circuit 702 and the transistor level implementation 702' may be a single stage logic gate. The single stage logic gate may include a pull-up circuit 716 configured to pull-up the memory clock (Memory CLK). The single stage logic gate may also include a pull-down circuit 718 coupled to pull-down the memory clock (Memory CLK). The pull-up circuit 716 and the pull-down circuit 718 are configured to be controlled by the reference clock (CLK, CPU CLK), a delayed reference clock (Delay CLK), and a gating signal (pn1).

The single stage logic gate may be further configured to enable the reference clock (CLK, CPU CLK) and the delayed reference clock (Delay CLK) to control the pull-up circuit 716 and the pull-down circuit 718 in response to one logic state of the gating signal (pn1). Additionally, the single stage logic gate is also further configured to enable one of the pull-up circuit 716 and the pull-down circuit 718 in response to another logic state of the gating signal (pn1) independent of the reference clock (CLK, CPU CLK) and the delayed reference clock (Delay CLK).

The single stage logic gate may include a memory clock output configured to provide the memory clock (Memory CLK) to the memory. The pull-up circuit 716 may be coupled between the memory clock output and a voltage rail and the pull-down circuit 718 may be coupled between the memory clock output and a voltage return rail.

In an example, the pull-up circuit (716) includes first and second serial pull-up transistors (704, 706) coupled between the memory clock output and the voltage rail. The first pull-up transistor (706) may be configured to be controlled by the reference clock (CLK, CPU CLK) and the second pull-up transistor (704) may be configured to be controlled by a delayed reference clock (Delay CLK). The pull-down circuit (718) includes first and second parallel transistors (710, 714) coupled between the memory clock output and the voltage return rail. The first pull-down transistor (710) may be configured to be controlled by the reference clock (CLK, CPU CLK) and the second pull-down transistor (714) may be configured to be controlled by a delayed reference clock (Delay CLK).

In an example, the pull-up circuit further includes a third pull-up transistor (708) coupled between the memory clock output and the voltage rail in parallel with the first and the second serial pull-up transistors (704, 706). The pull-down circuit further includes a third pull-down transistor (712) coupled in series with the first and the second parallel pull-down transistors (710, 714) between the memory clock output and the voltage return rail. Additionally, each of the third pull-up and the third pull-down transistors (708, 712) may be controlled by a gating signal (pn1).

Figure 8:
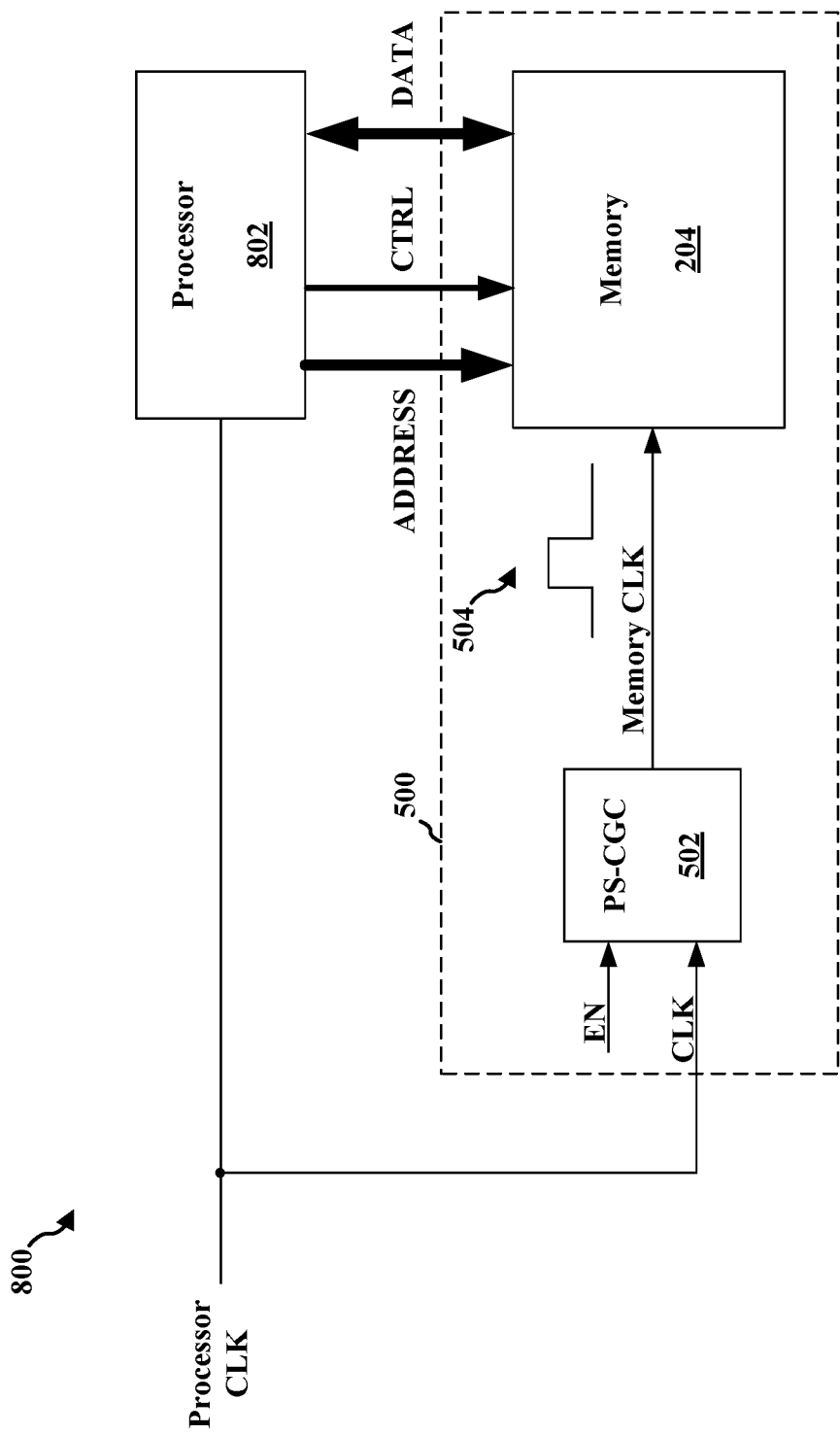
FIG. 8 is a diagram illustrating a computing apparatus employing aspects of the systems and methods described herein.

FIG. 8 is a diagram illustrating a computing apparatus 800 employing aspects of the systems and methods described herein. The computing apparatus 800 includes a processor 802 and the clocked memory system 500 of FIG. 5. The clocked memory system 500 within the computing apparatus 800 include a memory 204. The memory 204 is coupled to the processor 802. For example, an address bus, a data bus, and a control bus couple the memory 204 to the processor 802. The memory 204 may be configured to receive the memory clock (Memory CLK).

The computing apparatus 800 may also include a PS-CGC 502. The PS-CGC 502 may be a single stage logic gate. The single stage logic gate may be configured to generate the memory clock (Memory CLK) from a reference clock (e.g., CLK 102 of FIG. 1). The memory clock (Memory CLK) 504 may be a gated clock. Additionally, the memory clock (Memory CLK) 504 may have a wider pulse width than the reference clock (CLK).

FIG. 9 is a timing diagram 900 illustrating an example clock signal (CLK) 102 and a CGC pulse (memory clock signal 206). More specifically, the timing diagram 900 illustrates an example of a single pulse of the clock signal (CLK) 102. The timing diagram 900 also illustrates a stretched CGC pulse (clock signal 504) that may be generated in accordance with the systems and methods described herein. As illustrated in the timing diagram 900, there may be a delay 4240 between the rising edge of the clock signal (CLK) 102 and the rising edges of the original CGC pulse (memory clock signal 206) and the stretched CGC pulse (clock signal 504). The delay ($t_2-t_1$) may be due to delays through the circuitry that generates the original CGC pulse (memory clock signal 206) and the stretched CGC pulse (clock signal 504). Using the systems and methods described herein, the original CGC pulse (memory clock signal 206) and the stretched CGC pulse (clock signal 504) may have the same or nearly the same rising edge. In the illustrated example of FIG. 9, each of the clock signal (CLK) 102, CGC pulse (clock signal 504), and stretched CGC pulse (clock signal 504) may be at a logic high voltage at $t_3$. The clock signal (CLK) 102 may begin to transition from a logic high voltage to a logic low voltage at a time, $t_4$. The original CGC pulse (memory clock signal 206) may begin to transition from a logic high voltage to a logic low voltage at a time, $t_5$ after a delay ($t_5-t_4$). The delay ($t_5-t_4$) may be due to delays through the circuitry that generates the original CGC pulse (memory clock signal 206). In the illustrated example of FIG. 9, both the clock signal (CLK) 102 and the CGC pulse (clock signal 504) may be at a logic low voltage at $t_6$. The stretched CGC pulse (clock signal 504) may be at a logic low voltage at $t_7$. The stretched CGC pulse (clock signal 504) may be stretched to $t_7$, e.g., the stretched CGC pulse (clock signal 504) has a longer duration than the original CGC pulse (memory clock signal 206) and reaches the logic low voltage at $t_7$.

On example is a memory apparatus (e.g., clocked memory system 500). The memory apparatus (e.g., clocked memory system 500) may include a memory (204) configured to receive a memory clock (Memory CLK). The memory apparatus (e.g., clocked memory system 500) may also include a single stage logic gate (within 502, 702) configured to generate the memory clock (Memory CLK) from a reference clock (CLK, CPU CLK). The memory clock (Memory CLK) may be a gated clock and may have a wider pulse width than the reference clock (CLK, CPU CLK).

In an example, the single stage logic gate (circuit 702) includes a pull-up circuit (716) configured to pull-up the memory clock (Memory CLK), and a pull-down circuit (718) coupled to pull-down the memory clock (Memory CLK).

In an example, the pull-up circuit (716) and the pull-down circuit (718) are configured to be controlled by the reference clock (CLK, CPU CLK), a delayed reference clock (Delay CLK), and a gating signal (pn1).

In an example, the apparatus includes a delay circuit (buffer 602) configured to generate the delayed reference clock (Delay CLK) from the reference clock (CLK, CPU CLK).

An example includes a latch (608) configured to generate the gating signal (pn1). The latch (608) is further configured to latch the gating signal (pn1) with a trailing edge of the reference clock (CLK, CPU CLK).

In an example, the single stage logic gate (circuit 702) is further configured to enable the reference clock (CLK, CPU CLK) and the delayed reference clock (Delay CLK) to control the pull-up circuit (716) and the pull-down circuit (718) in response to one logic state of the gating signal (pn1). The single stage logic gate (circuit 702) is also further configured to enable one of the pull-up circuit (716) and the pull-down circuit (718) in response to another logic state of the gating signal (pn1) independent of the reference clock (CLK, CPU CLK) and the delayed reference clock (Delay CLK).

In an example, the single stage logic gate (circuit 702) includes a memory clock output configured to provide the memory clock (Memory CLK) to the memory. The pull-up circuit (716) may be coupled between the memory clock output and a voltage rail and the pull-down circuit (718) may be coupled between the memory clock output and a voltage return rail.

In an example, the pull-up circuit (716) includes first and second serial pull-up transistors (704, 706) coupled between the memory clock output and the voltage rail. The first pull-up transistor (706) may be configured to be controlled by the reference clock (CLK, CPU CLK) and the second pull-up transistor (704) may be configured to be controlled by a delayed reference clock (Delay CLK). The pull-down circuit (718) includes first and second parallel transistors (710, 714) coupled between the memory clock output and the voltage return rail. The first pull-down transistor (710) may be configured to be controlled by the reference clock (CLK, CPU CLK) and the second pull-down transistor (714) may be configured to be controlled by a delayed reference clock Delay CLK).

In an example, the pull-up circuit further includes a third pull-up transistor (708) coupled between the memory clock output and the voltage rail in parallel with the first and the second serial pull-up transistors (704, 706). The pull-down circuit further includes a third pull-down transistor (712) coupled in series with the first and the second parallel pull-down transistors (710, 714) between the memory clock output and the voltage return rail. Additionally, each of the third pull-up and the third pull-down transistors (708, 712) may be controlled by a gating signal (pn1).

An computing apparatus (800) may include a processor (802). The computing apparatus (800) may also include a memory (208). The memory (208) may be coupled to the processor (802). The memory (208) may be configured to receive a memory clock (Memory CLK). The memory apparatus (e.g., clocked memory system 500) may also include a single stage logic gate (within 502, 702) configured to generate the memory clock (Memory CLK) from a reference clock (CLK, CPU CLK). The memory clock (Memory CLK) may be a gated clock and may have a wider pulse width than the reference clock (CLK, CPU CLK).

In an example, a memory apparatus may include means to store data (e.g., memory 204). The means to store data (e.g., memory 204) may be configured to receive a memory clock (Memory CLK). The memory apparatus may include means to generate the memory clock (clock signal 504) from a reference clock (CLK, CPU CLK) in a single logic gate stage (circuit 702). The memory clock (Memory CLK) may be a gated clock and may have a wider pulse width than the reference clock (CLK, CPU CLK).

In an example, the means to generate the memory clock includes a pull-up circuit (716) configured to pull-up the memory clock and a pull-down circuit (718) coupled to pull-down the memory clock.

It is understood that the specific order or hierarchy of blocks in the processes/flowcharts disclosed is an illustration of exemplary approaches. Based upon design preferences, the specific order or hierarchy of blocks in the processes/flowcharts may be rearranged. Further, some blocks may be combined or omitted. The accompanying method claims present elements of the various blocks in a sample order, and are not meant to be limited to the specific order or hierarchy presented.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but is to be accorded the full scope consistent with the language claims, wherein reference to an element in the singular is not intended to mean "one and only one" unless specifically so stated, but rather "one or more." The word "exemplary" is used herein to mean "serving as an example, instance, or illustration." Any aspect described herein as "exemplary" is not necessarily to be construed as preferred or advantageous over other aspects. Unless specifically stated otherwise, the term "some" refers to one or more. Combinations such as "at least one of A, B, or C," "one or more of A, B, or C," "at least one of A, B, and C," "one or more of A, B, and C," and "A, B, C, or any combination thereof" include any combination of A, B, and/or C, and may include multiples of A, multiples of B, or multiples of C. Specifically, combinations such as "at least one of A, B, or C," "one or more of A, B, or C," "at least one of A, B, and C," "one or more of A, B, and C," and "A, B, C, or any combination thereof" may be A only, B only, C only, A and B, A and C, B and C, or A and B and C, where any such combinations may contain one or more member or members of A, B, or C. All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. The words "module," "mechanism," "element," "device," and the like may not be a substitute for the word "means." As such, no claim element is to be construed as a means plus function unless the element is expressly recited using the phrase "means for."

What is claimed is:

1. A memory apparatus, comprising:
a memory configured to receive a memory clock; and
a single stage logic gate configured to generate the memory clock from a reference clock, the memory clock being a gated clock and having a wider pulse width than the reference clock, wherein the single stage logic gate comprises a pull-up circuit configured to pull-up the memory clock, and a pull-down circuit coupled to pull-down the memory clock, the pull-up circuit and the pull-down circuit are configured to be controlled by the reference clock, a delayed reference clock, and a gating signal, and the single stage logic gate is further configured to enable the reference clock and the delayed reference clock to control the pull-up circuit and the pull-down circuit in response to one logic state of the gating signal, and enable one of the pull-up circuit and the pull-down circuit in response to another logic state of the gating signal independent of the reference clock and the delayed reference clock.

2. The memory apparatus of claim 1, further comprising a delay circuit configured to generate the delayed reference clock from the reference clock.

3. The memory apparatus of claim 1, further comprising a latch configured to generate the gating signal, the latch further being configured to latch the gating signal with a trailing edge of the reference clock.

4. A memory apparatus, comprising:
a memory configured to receive a memory clock; and
a single stage logic gate configured to generate the memory clock from a reference clock, the memory clock being a gated clock and having a wider pulse width than the reference clock, wherein the single stage logic gate comprises a pull-up circuit configured to pull-up the memory clock, and a pull-down circuit coupled to pull-down the memory clock, the pull-up circuit and the pull-down circuit are configured to be controlled by the reference clock, a delayed reference clock, and a gating signal, and the single stage logic gate comprises a memory clock output configured to provide the memory clock to the memory, the pull-up circuit being coupled between the memory clock output and a voltage rail and the pull-down circuit being coupled between the memory clock output and a voltage return rail.

5. The memory apparatus of claim 4, wherein the pull-up circuit comprises a first serial pull-up transistor and a second serial pull-up transistor coupled between the memory clock output and the voltage rail, the first serial pull-up transistor being configured to be controlled by the reference clock and the second pull-up transistor being configured to be controlled by a delayed reference clock, and wherein the pull-down circuit comprises a first parallel pull-down transistor and a second parallel pull-down transistor each coupled between the memory clock output and the voltage return rail, the first parallel pull-down transistor being configured to be controlled by the reference clock and the second parallel pull-down transistor being configured to be controlled by the delayed reference clock.

6. The memory apparatus of claim 5, wherein the pull-up circuit further comprises a third pull-up transistor coupled between the memory clock output and the voltage rail in parallel with the first serial pull-up transistor and the second serial pull-up transistor, and wherein the pull-down circuit further comprises a third pull-down transistor coupled in series with the first parallel pull-down transistor and the second parallel pull-down transistor between the memory clock output and the voltage return rail, each of the third pull-up transistor and the third pull-down transistors being controlled by a gating signal.

7. An apparatus, comprising:
a processor;
a memory coupled to the processor, the memory configured to receive a memory clock; and
a single stage logic gate configured to generate the memory clock from a reference clock, the memory clock being a gated clock and having a wider pulse width than the reference clock, wherein the single stage logic gate comprises a pull-up circuit configured to pull-up the memory clock, and a pull-down circuit coupled to pull-down the memory clock, the pull-up circuit and the pull-down circuit are configured to be controlled by the reference clock, a delayed reference clock, and a gating signal, and the single stage logic gate is further configured to enable the reference clock and the delayed reference clock to control the pull-up circuit and the pull-down circuit in response to one logic state of the gating signal, and enable one of the pull-up circuit and the pull-down circuit in response to another logic state of the gating signal independent of the reference clock and the delayed reference clock.

8. The apparatus of claim 7, further comprising a delay circuit configured to generate the delayed reference clock from the reference clock.

9. The apparatus of claim 7, further comprising a latch configured to generate the gating signal, the latch further being configured to latch the gating signal with a trailing edge of the reference clock.

10. An apparatus, comprising:
a processor;
a memory coupled to the processor, the memory configured to receive a memory clock; and
a single stage logic gate configured to generate the memory clock from a reference clock, the memory clock being a gated clock and having a wider pulse width than the reference clock, wherein the single stage logic gate comprises a pull-up circuit configured to pull-up the memory clock, and a pull-down circuit coupled to pull-down the memory clock, the pull-up circuit and the pull-down circuit are configured to be controlled by the reference clock, a delayed reference clock, and a gating signal, and the single stage logic gate comprises a memory clock output configured to provide the memory clock to the memory, the pull-up circuit being coupled between the memory clock output and a voltage rail and the pull-down circuit being coupled between the memory clock output and a voltage return rail.

11. The apparatus of claim 10, wherein the pull-up circuit comprises a first serial pull-up transistor and a second serial pull-up transistor coupled between the memory clock output and the voltage rail, the first serial pull-up transistor being configured to be controlled by the reference clock and the second serial pull-up transistor being configured to be controlled by the delayed reference clock, and wherein the pull-down circuit comprises a first parallel pull-down transistor and a second parallel pull-down transistor coupled between the memory clock output and the voltage return rail, the first parallel pull-down transistor being configured to be controlled by the reference clock and the second parallel pull-down transistor being configured to be controlled by the delayed reference clock.

12. The apparatus of claim 11, wherein the pull-up circuit further comprises a third pull-up transistor coupled between the memory clock output and the voltage rail in parallel with the first serial pull-up transistor and the second serial pull-up transistor, and wherein the pull-down circuit further comprises a third pull-down transistor coupled in series with the first parallel pull-down transistor and the second parallel pull-down transistor between the memory clock output and the voltage return rail, each of the third pull-up transistor and the third pull-down transistor being controlled by a gating signal.

13. A memory apparatus, comprising:
    means for storing data, configured to receive a memory clock; and
    means for generating the memory clock from a reference clock in a single logic gate stage, the memory clock being a gated clock and having a wider pulse width than the reference clock, wherein the single stage logic gate stage comprises a pull-up circuit configured to pull-up the memory clock, and a pull-down circuit coupled to pull-down the memory clock, the pull-up circuit and the pull-down circuit are configured to be controlled by the reference clock, a delayed reference clock, and a gating signal, and the single stage logic gate is further configured to enable the reference clock and the delayed reference clock to control the pull-up circuit and the pull-down circuit in response to one logic state of the gating signal, and enable one of the pull-up circuit and the pull-down circuit in response to another logic state of the gating signal independent of the reference clock and the delayed reference clock.

14. The memory apparatus of claim 13, wherein the means for generating the memory clock comprises a pull-up circuit configured to pull-up the memory clock, and a pull-down circuit coupled to pull-down the memory clock.

\* \* \* \* \*